United States Patent
Hwang et al.

(10) Patent No.: US 12,371,590 B2
(45) Date of Patent: Jul. 29, 2025

(54) ADHESIVE FILM

(71) Applicant: 3M INNOVATIVE PROPERTIES COMPANY, St. Paul, MN (US)

(72) Inventors: Kyosung Hwang, Seoul (KR); Yongsuk Yang, Hwaseong-si (KR); Shunsuke Suzuki, Tokyo (JP)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 756 days.

(21) Appl. No.: 17/769,714

(22) PCT Filed: Oct. 14, 2020

(86) PCT No.: PCT/IB2020/059614
§ 371 (c)(1),
(2) Date: Apr. 15, 2022

(87) PCT Pub. No.: WO2021/074794
PCT Pub. Date: Apr. 22, 2021

(65) Prior Publication Data
US 2022/0372339 A1     Nov. 24, 2022

(30) Foreign Application Priority Data
Oct. 18, 2019   (KR) ........................ 10-2019-0130024

(51) Int. Cl.
*C09J 7/30* (2018.01)
*C09J 7/25* (2018.01)
(Continued)

(52) U.S. Cl.
CPC .  *C09J 7/30* (2018.01); *C09J 7/25* (2018.01); *C09J 7/29* (2018.01); *C09J 2301/124* (2020.08);
(Continued)

(58) Field of Classification Search
CPC . C09J 7/25; C09J 183/00; C09J 183/04; C09J 183/06; C09J 183/08
See application file for complete search history.

(56) References Cited

U.S. PATENT DOCUMENTS

| | | |
|---|---|---|
| 6,143,117 A | 11/2000 | Kelly et al. |
| 7,728,065 B2 | 6/2010 | Ozaki et al. |

(Continued)

FOREIGN PATENT DOCUMENTS

| | | |
|---|---|---|
| CN | 103009734 | 10/2014 |
| JP | 2007-246848 | 9/2007 |

(Continued)

OTHER PUBLICATIONS

Machine translation of WO 2015-147509 (Year: 2015).*

(Continued)

*Primary Examiner* — Zachary M Davis
(74) *Attorney, Agent, or Firm* — Jeffrey M. Olofson

(57) ABSTRACT

The present disclosure relates to an adhesive film, which includes: a photothermal conversion layer including a light absorbing agent and a pyrolytic resin; a first adhesive layer disposed on the photothermal conversion layer; a base film layer disposed on the first adhesive layer; and a second adhesive layer disposed on the base film layer, and the first adhesive layer and the second adhesive layer include a silicon-based adhesive. The adhesive film according to the present disclosure can simplify a process of processing a substrate, and can prevent a damage of the substrate and a circuit or an element formed on the substrate.

9 Claims, 3 Drawing Sheets

(51) Int. Cl.
  *C09J 7/29*  (2018.01)
  *H01L 21/683*  (2006.01)
(52) U.S. Cl.
  CPC .... *C09J 2301/408* (2020.08); *C09J 2400/163* (2013.01); *C09J 2479/086* (2013.01); *C09J 2483/00* (2013.01); *H01L 21/6836* (2013.01)

(56) References Cited

U.S. PATENT DOCUMENTS

| | | | |
|---|---|---|---|
| 8,789,569 | B2 | 7/2014 | Noda |
| 9,184,083 | B2 | 11/2015 | Mahoney et al. |
| 2005/0118362 | A1 | 6/2005 | Kim et al. |
| 2007/0077685 | A1 | 4/2007 | Noda et al. |
| 2009/0017248 | A1 | 1/2009 | Larson et al. |
| 2009/0017323 | A1 | 1/2009 | Webb et al. |
| 2010/0041211 | A1* | 2/2010 | Noda ............... H01L 21/6835 438/464 |
| 2011/0073847 | A1 | 3/2011 | Kobayashi et al. |
| 2013/0284039 | A1 | 10/2013 | Sugasaki |
| 2015/0030884 | A1 | 1/2015 | Park et al. |
| 2016/0104690 | A1 | 4/2016 | Hu |
| 2016/0133486 | A1 | 5/2016 | Andry et al. |
| 2017/0222079 | A1 | 8/2017 | Li et al. |
| 2020/0010735 | A1 | 1/2020 | Yang |

FOREIGN PATENT DOCUMENTS

| | | |
|---|---|---|
| WO | 2004/006296 | 1/2004 |
| WO | 2008/00893 | 1/2008 |
| WO | 2009058985 A1 | 5/2009 |
| WO | 2015147509 A1 | 10/2015 |
| WO | 2018109711 A1 | 6/2018 |

OTHER PUBLICATIONS

Dalapati, "Color Tunable low-cost transparent heat reflector using copper and titanium oxide for energy saving application", Scientific Reports, 2016, vol. 6, No. 1, 14 pages.

International Search Report for PCT Application No. PCT/IB20/59614 mailed on Mar. 26, 2021, 2 pages.

Zhou, "Nano-Cr-film-based solar selective absorber with high photothermal conversion efficiency and good thermal stability", Optics express, 2012, vol. 20, No. 27, pp. 28953-28962.

\* cited by examiner

ADHESIVE FILM

CROSS REFERENCE TO RELATED APPLICATIONS

This application is a national stage filing under 35 U.S.C. 371 of PCT/IB2020/059614, filed 14 Oct. 2020, which claims the benefit of Korean Application No. 10-2019-0130024, filed 18 Oct. 2019, the disclosure of which is incorporated by reference in their entirety herein.

BACKGROUND

The present disclosure relates to an adhesive film, and more particularly, to an adhesive film which is disposed between a substrate to be processed and a supporter in a process of processing the substrate.

In various fields, a thin-film type substrate or a substrate having flexibility is preferably used. In a process where such a thin-film type substrate is formed or a substrate having flexibility is used, a process of bonding the substrate to a hard supporter, and then separating the substrate from the hard supporter after processing of the substrate is completed has been suggested.

For example, in the field of quartz devices, it is preferable to reduce a thickness of a quartz wafer in order to increase an oscillation frequency. In particular, in the semiconductor industry, an effort to reduce a thickness of a semiconductor wafer to achieve high-density manufacturing by chip stacking technology and to reduce a thickness of a semiconductor package is ongoing.

Thickness reduction is performed by grinding a so-called back surface of a semiconductor wafer on the opposite surface of a surface including a pattern-formed circuit. To reduce thickness, a method of grinding a back surface of a wafer with the wafer being securely fixed to a hard supporter through an adhesive, transferring the wafer, and then separating the wafer from the hard supporter has been suggested. The wafer is supported by using the hard supporter, so that the wafer can be prevented from being destroyed during the grinding of the back surface and the transferring, and the wafer can be processed to have a thin thickness.

In another example, a flexible display device which can reinforce an aesthetic function and can give multiple functions when it is in use is developing, and in this case, it is preferable to use a flexible substrate. The flexible display device is expected as a next-generation display device substituting for a portable computer, an electronic newspaper, or a smart card, and a printing medium such as a book, a newspaper, a magazine, etc. As reinforcement of an aesthetic function, slimness, and lightness of such display devices are in progress, diversity of materials is required, and various flexible substrates are applied and used. For example, a thin-film metal sheet and plastic, etc. may be used for the flexible substrate.

However, it may be difficult to apply the flexible substrate to existing manufacturing equipment for display devices that is designed for glass or or quartz substrates, due to its characteristic of being easily bent, and for example, the flexible substrate has difficulty in being conveyed by track equipment or a robot or being received in a cassette.

Accordingly, the flexible substrate is bonded to a hard supporter before elements are formed, and the supporter supports the flexible substrate while elements are formed on the flexible substrate, and after the elements are formed on the substrate, the supporter is detached from the flexible substrate. To this end, there is provided a flexible display device which has elements stably formed therein even if a flexible substrate is used.

However, this process requires an additional process, such as a step of coating an adhesive between the substrate and the hard supporter, a step of curing the adhesive, etc., and there is a problem that the process is complicated and requires additional cost and time. Furthermore, in the process of separating the substrate from the hard supporter after processing the substrate, a wafer or the substrate itself may be destroyed, or a circuit of the wafer and an element of the flexible substrate may be destroyed.

SUMMARY

An object of the present disclosure is to provide an adhesive film which can maintain high adhesion in the process of processing, and allows a substrate fixed onto a supporter to be easily detached from the supporter after the processing process. Accordingly, the present disclosure can prevent the substrate and an element or a circuit formed on the substrate from being damaged and destroyed by a physical force when the substrate is separated from the supporter.

In addition, another object of the present disclosure is to provide an adhesive film which has an excellent heat-resisting property and an excellent light-blocking effect, so that a substrate to be processed and an element or a circuit formed on the substrate can be prevented from being damaged.

In addition, still another object of the present disclosure is to provide an adhesive film which can simplify a process of fixing a substrate to be processed onto a supporter and detaching, so that a cost and a time can be saved.

An adhesive film of the present disclosure to solve the above-described problems of the related-art technology includes: a photothermal conversion layer including a light absorbing agent and a pyrolytic resin; a first adhesive layer disposed on the photothermal conversion layer; a base film layer disposed on the first adhesive layer; and a second adhesive layer disposed on the base film layer, and the first adhesive layer and the second adhesive layer include a silicon-based adhesive.

One or more of the first adhesive layer and the second adhesive layer may additionally include a benzoyl peroxide curing agent.

One or more of the first adhesive layer and the second adhesive layer may additionally include $TiO_2$.

One or more of the first adhesive layer and the second adhesive layer may include a radical curing silicon-based adhesive or an addition curing silicon-based adhesive.

The first adhesive layer may include an addition curing silicon-based adhesive, and the second adhesive layer may include a radical curing silicon-based adhesive.

The adhesive film may further include a primer layer disposed between the second adhesive layer and the base film layer.

The base film layer may be a PI film.

The base film layer may have a protrusion formed on a side surface of the adhesive film.

The pyrolytic resin may have a —COOH or —OH functional group, and may include two kinds of acrylic resins having different weight average molecular weights.

The adhesive film may further include a metal layer disposed on at least one surface of the base film.

The metal layer may include metal selected from the group consisting of copper, aluminum, tungsten, silver, gold, chrome, and a combination thereof.

The adhesive film according to the present disclosure can maintain high adhesion in the process of processing, and allows a substrate fixed onto a supporter to be easily detached from the supporter after the processing process. Accordingly, the present disclosure can prevent a substrate and elements or circuits formed on the substrate from being damaged and destroyed by a physical force when the substrate is separated from the supporter. In addition, the adhesive film according to the present disclosure has an excellent heat-resisting property and an excellent light-blocking effect. In addition, the adhesive film according to the present disclosure can simplify a process of fixing a substrate to be processed onto a supporter and detaching, so that a cost and a time can be saved.

DETAILED DESCRIPTION

Figure 1:
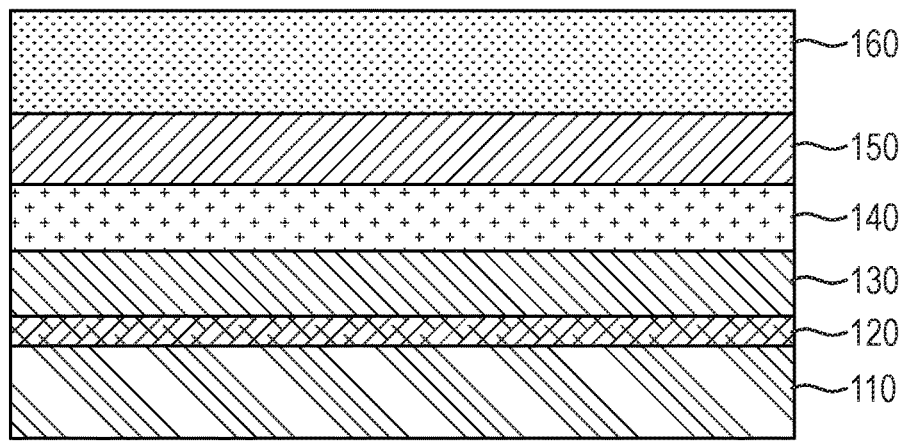
FIG. 1 is a cross-sectional view of an adhesive film according to an embodiment of the present disclosure.

Advantages and features of the present disclosure, and a method for achieving the same will be clarified by referring to embodiments described in detail below along with the accompanying drawings. However, the present disclosure is not limited to the exemplary embodiments set forth herein, and may be embodied in many different forms. Rather, the exemplary embodiments are provided so that the present disclosure will be thorough and complete, and will fully convey the scope of the present disclosure to those of ordinary skill in the art, and the present disclosure is defined by the scope of the claims.

Shapes, sizes, ratio, angles, numbers, etc. disclosed in the drawings to explain embodiments of the present disclosure are merely examples, and the present disclosure is not limited to matters illustrated in the drawings. The same reference numerals indicate the same components throughout the specification. Further, in the description of the present disclosure, certain detailed explanations of related-art technology are omitted when it is deemed that they may unnecessarily obscure the essence of the present disclosure.

When the terms "include", "have", etc. are used in the specification, other matters may be added in addition to described matters unless the expression "only" is used. When a component is expressed as singular form, any references to the singular form may include plural form unless expressly stated otherwise.

In interpreting a component, the component should be interpreted as including an error range even if it is not clearly indicated.

When a position relationship is described, for example, a position relationship between two portions such as "on", "on an upper portion", "on a lower portion", "beside", etc., one or more other portion may be positioned between the two portions unless "right" or "directly" is used.

Respective features of embodiments of the present disclosure may be coupled or combined in part or entirely, and various technical interlocking and operations are possible.

Hereinafter, embodiments of the present disclosure will be described in detail with reference to the drawings. Embodiments introduced hereinbelow are provided as examples, so that the present disclosure will fully convey the technical concept of the present disclosure to those of ordinary skill in the art. Accordingly, the present disclosure is not limited to the embodiments described hereinbelow and can be implemented in other forms.

FIG. 1 is a cross-sectional view of an adhesive film according to an embodiment of the present disclosure. Referring to FIG. 1, the adhesive film according to an embodiment of the present disclosure includes a first liner 110, a photothermal conversion layer 120, a first adhesive layer 130, a base film layer 140, a second adhesive layer 150, and a second liner 160, which are stacked in sequence.

The adhesive film of the present disclosure is of a film type, and is formed by forming the first adhesive layer 130 and the second adhesive layer 150 on both side surfaces of the rigid base film layer 140, respectively, and brining the first adhesive layer 130 and the photothermal conversion layer 120 into contact with each other.

That is, the present disclosure forms one film having a multi-layered structure as an adhesive film, rather than directly coating a supporter and a substrate to be processed with a liquid material. In a subsequent process of processing the substrate, the second adhesive layer 150 is bonded to the substrate, and the photothermal conversion layer 120 is bonded to a hard supporter.

More specifically, the photothermal conversion layer 120 is divided when radiant energy such as a laser is projected, so that the substrate can be separated from the supporter without damaging the substrate or an element or a circuit on the substrate.

The photothermal conversion layer 120 includes a light absorbing agent and a pyrolytic resin. Radiant energy applied to the photothermal conversion layer 120 in the form of a laser is absorbed by the light absorbing agent, and is converted into thermal energy. The generated thermal energy abruptly increases a temperature of the photothermal conversion layer 120, and the temperature reaches a pyrolysis temperature of the pyrolytic resin (organic component) in the photothermal conversion layer 120, causing pyrolysis of the resin. A gas generated by the pyrolysis forms an opening layer (such as a space) in the photothermal conversion layer 120, and divides the photothermal conversion layer 120 into two portions, and accordingly, the supporter and the substrate are separated.

The light absorbing agent may absorb radiant energy and may convert the radiant energy into thermal energy. In addition, the light absorbing agent functions to block light and can prevent the substrate from being damaged by a laser, etc.

Although the light absorbing agent changes dependently on a wavelength of the laser, examples of a usable light absorbing agent include carbon black, graphite powder, ultra-fine metal powder such as iron, aluminum, copper, nickel, cobalt, manganese, chrome, zinc, and tellurium, metallic oxide powder such as black titanium oxide, and dye and pigment such as aromatic diamino-based metal complex, aliphatic diamine-based metal complex, aromatic dithiol-base metal complex, mercaptophenol-based metal complex, squarylium-based compound, a cyanine-based dye, methine-based dye, naphthoquinone-based dye and anthraquinone-based dye. The light absorbing agent may be in the form of a film including a vapor-deposited metal film.

From among the light absorbing agents, carbon black is in particular useful since carbon black noticeably reduces a force necessary for separating the substrate from the supporter after projection, and accelerates separation.

A particle size of the light absorbing agent in the photothermal conversion layer 120 may be about 20 nm to about 2000 nm, preferably, may be about 50 nm to about 1000 nm, and more preferably, may be about 100 nm to about 350 nm.

If the particle size of the light absorbing agent is less than about 20 nm, it may be difficult to disperse, and a large amount of light absorbing agent may not be loaded because a surface area increases as a particle size is smaller, and there is a limit to a loading content. In addition, if the particle size of the light absorbing agent exceeds about 2000 nm, laser blocking performance may be reduced, and performance of dividing the photothermal conversion layer 120 by a laser may be reduced. In addition, as a particle size of the light absorbing agent increases, a film forming ability may be reduced, and dispersion stability after dispersion may be reduced, and time required to make a production liquid and to coat should be short.

A content of the light absorbing agent in the photothermal conversion layer 120 may be about 5 weight % to about 80 weight % with reference to a total weight of the photothermal conversion layer 120, preferably, may be about 10 weight % to about 60 weight %, and more preferably, may be about 20 weight % to about 50 weight %.

If the content of the light absorbing agent is less than about 5 weight %, it is difficult to separate by a laser. In addition, if the content of the light absorbing agent exceeds about 80 weight %, a portion of the photothermal conversion layer 120 separated by the laser remains on the surface of the first adhesive layer 130 after the photothermal conversion layer 120 is separated by the laser, and in this case, adhesion may be very low due to a high content of carbon.

In this case, there is a problem that in a process of removing the first adhesive layer 130, the base film layer 140, and the adhesive layer 150 by a removal tape, the portion of the photothermal conversion layer is not well attached to the removal tape and is difficulty to remove. In addition, as the content of the light absorbing agent increases, adhesion of the surface of the photothermal conversion layer 120 becomes lower and it is difficult to laminate on the supporter and dispersion of the light absorbing agent is not uniform.

The pyrolytic resin in the photothermal conversion layer 120 includes an acrylic resin. Preferably, the acrylic resin includes a monomer selected from the group consisting of methyl methacrylate (MMA), hydroxyethyl methacrylate (HEMA), ethyl acrylate (EA), butyl acrylate (BA), acrylonitrile (AN), and a combination thereof. Preferably, the monomer may be selected from a combination of three or more of methyl methacrylate (MMA), hydroxyethyl methacrylate (HEMA), ethyl acrylate (EA), butyl acrylate (BA), and acrylonitrile (AN). Such an acrylic resin may have an appropriate molecular weight, Tg, a heat-resisting property, and a functional group.

A content of the acrylic resin may be about 5 weight % to about 80 weight % with reference to a total weight of the photothermal conversion layer 120, preferably, may be about 15 weight % to about 60 weight %, and more preferably, may be about 40 weight % to about 60 weight %. If the content of the acrylic resin is less than about 5 weight %, a film forming ability is reduced and it is difficult to adjust a thickness of the photothermal conversion layer 120, and it is difficult to laminate on the supporter since adhesion of the surface of the photothermal conversion layer 120 is very low. In addition, if the content of the acrylic resin exceeds about 80 weight %, a great physical force is required when the photothermal conversion layer 120 is divided after laser projection, and it may be difficult to separate the substrate and the supporter, and the substrate and an element or a circuit formed on the substrate may be damaged.

The acrylic resin preferably includes two kinds of acrylic resins having different weight average molecular weights, and more preferably, includes a high molecular weight acrylic resin and a low molecular weight acrylic resin. The high molecular weight acrylic resin makes the photothermal conversion layer 120 have an excellent heat resisting property, and the low molecular weight acrylic resin enhances adhesion of the photothermal conversion layer 120 and is advantageous in making a film.

In this case, a glass transition temperature (Tg) of the high molecular weight acrylic rein may be 0° C. to 10° C., and a Tg of the low molecular weight acrylic resin may be −10° C. to 0° C. If the Tg of the high molecular weight acrylic resin is higher than 10° C. and the Tg of the low molecular weight acrylic resin is higher than 0° C., the heat resisting property of the photothermal conversion layer 120 may be enhanced, but adhesion of the surface may be reduced. On the other hand, if the Tg of the high molecular weight acrylic resin is lower than 0° C. and the Tg of the low molecular weight acrylic resin is lower than −10° C., bonding performance may be enhanced, but the heat resisting property may be reduced.

A weight average molecular weight of the high molecular weight acrylic resin may be about 400,000 g/mol to about 15,000,000 g/mol, preferably, may be about 500,000 g/mol to about 1,200,000 g/mol, and more preferably, may be about 700,000 g/mol to about 1,000,000 g/mol. If the weight average molecular weight of the high molecular weight acrylic resin is smaller than about 400,000 g/mol, the heat resisting property of the photothermal conversion layer 120 may be reduced, and, if the weight average molecular weight of the high molecular weight acrylic resin is larger than about 15,000,000 g/mol, it is not easy to coat and mix a production liquid of the photothermal conversion layer 120.

A weight average molecular weight of the low molecular weight acrylic resin may be about 50,000 g/mol to about 600,000 g/mol, preferably, may be about 100,000 g/mol to about 500,000 g/mol, and more preferably, may be about 400,000 g/mol to about 500,000 g/mol. If the weight average molecular weight of the low molecular weight acrylic resin is smaller than about 50,000 g/mol, the heat resisting property of the photothermal conversion layer 120 is reduced, and, if the weight average molecular weight of the low molecular weight acrylic resin is larger than about 600,000 g/mol, lamination performance of the photothermal conversion layer 120 is reduced.

A weight ratio of the low molecular weight acrylic resin:the high molecular weight acrylic resin may be about 1:4 to about 4:1, preferably, may be about 1:3 to about 3:1, and more preferably, may be about 1:2 to about 2:1. If a content of the low molecular weight acrylic resin is greatly smaller than a content of the high molecular weight acrylic resin, lamination performance of the photothermal conversion layer 120 is reduced. In addition, if the content of the high molecular weight acrylic resin is greatly smaller than the content of the low molecular weight acrylic resin, the heat resisting property of the photothermal conversion layer 120 is reduced, and adhesion on the divided surface of the photothermal conversion layer 120 after laser projection is strong, and accordingly, a physically large force is required to separate.

The pyrolytic resin has a —COOH or —OH functional group. Preferably, the pyrolytic resin includes an acrylic resin having the —COOH or —OH functional group. The photothermal conversion layer 120 including the pyrolytic resin having the —COOH or —OH functional group is not a pressure-sensitive adhesive type. The photothermal conversion layer 120 has the —COOH or —OH functional group, such that the photothermal conversion layer 120 can be bonded with the supporter by hydrogen bonding, and, for example, may be hydrogen-bonded with a silanol group on a glass surface of the supporter formed with glass. In this case, the hydrogen bonding provides initial adhesion to bond the adhesive layer to the supporter, and stickiness between the photothermal conversion layer 120 and the supporter may greatly increase due to heat generated in a process after the bonding process.

The —COOH or —OH functional group may have an acid value greater than or equal to about 1 mgKOH/g, preferably, greater than or equal to about 5 mgKOH/g. The lamination performance of the photothermal conversion layer 120 is based on the —COOH or —OH functional group, and, if the acid value of the —COOH or —OH functional group is lower than about 1 mgKOH/g, the lamination performance is reduced. An upper limit of the acid value of the —COOH or —OH does not bring about a problem. However, due to a chemical structure, the acid value may preferably have about 1 mgKOH/g to about 50 mgKOH/g, more preferably, about 1 mgKOH/g to about 30 mgKOH/g, and most preferably, about 10 mgKOH/g to about 20 mgKOH/g.

The photothermal conversion layer 120 may further include an inorganic filler. The inorganic filler functions to prevent the photothermal conversion layer 120 from being re-bonded after the photothermal conversion layer 120 is divided due to the opening layer formed as a result of pyrolysis of the pyrolytic resin. Accordingly, when the photothermal conversion layer 120 is separated by projecting a laser after the substrate is processed, a physical force required to separate the substrate and the supporter may be additionally reduced.

The inorganic filler may be selected from the group consisting of $SiO_2$, $Al_2O_3$, $TiO_2$ and a combination thereof. In particular, in the case of $TiO_2$, there is an additional light blocking effect on the substrate.

A particle size of the inorganic filler in the photothermal conversion layer 120 may be about 20 nm to about 2000 nm, preferably, may be about 50 nm to about 1000 nm, and more preferably, may be about 100 nm to about 350 nm. If the particle size of the inorganic filler is less than about 20 nm, it is not easy to disperse the inorganic filler when the film is made, and there is a limit to an amount to be loaded. In addition, if the particle size of the inorganic filler exceeds about 2000 nm, the film forming ability is reduced and dispersion persistence after dispersion may be reduced.

A content of the inorganic filler in the photothermal conversion layer 120 may be about 4 weight % to about 60 weight % with reference to a total weight of the photothermal conversion layer 120, preferably, may be about 5 weight % to about 50 weight %, and more preferably, may be about 5 weight % to about 30 weight %. If the content of the inorganic filler is less than about 4 weight %, adhesion on the surface separated after the separation process by laser projection is strong, and the photothermal conversion layer 120 may be re-bonded as time is elapsed. In addition, if the content of the inorganic filler exceeds about 60 weight %, the adhesion of the photothermal conversion layer 120 is very low and it is difficult to laminate on the supporter, and the film forming ability is reduced and dispersion is not uniform.

The photothermal conversion layer 120 may further include an dispersing agent. A content of the dispersing agent may be about 0.1 weight % to about 10 weight % with reference to a total weight of the photothermal conversion layer 120, preferably, may be about 0.1 weight % to about 7 weight %, and more preferably, may be about 0.1 weight % to about 5 weight %. If the content of the dispersing agent is less than about 0.1 weight %, dispersion of the light absorbing agent and the inorganic filler in the photothermal conversion layer 120 may be reduced, and dispersion persistence after dispersion may also be reduced. In addition, if the content of the dispersing agent exceeds about 10 weight %, the heat resisting property of the photothermal conversion layer 120 may be reduced, and added additives may be decomposed at a high temperature, and a loss in weight may increase.

A thickness of the photothermal conversion layer 120 may be about 1 μm to about 30 μm, preferably, may be about 3 μm to about 20 μm, and more preferably, may be about 5 μm to about 15 μm. If the thickness of the photothermal conversion layer 120 is less than about 1 μm, an upper adhesive layer may directly influence the material, and laser blocking performance by the light absorbing agent may be reduced. In addition, if the thickness of the photothermal conversion layer 120 exceeds about 30 μm, many adhesive residues may remain on the supporter after laser projection.

The photothermal conversion layer 120 may be formed on the adhesive-based film layer 130 in the form of a film. If the photothermal conversion layer 120 is formed by being directly coated on the supporter in a liquid form, a viscosity is low and thickness is formed to be less than about 1 μm, and a sufficient thickness is not formed. To this end, it is difficult to use the light absorbing agent enough to block a laser, and it is difficult to prevent a damage to the substrate by the laser.

The photothermal conversion layer 120 according to the present disclosure is formed in the form of a film, such that it is easy to adjust the thickness thereof and the photothermal conversion layer 120 is more advantageous to protecting the substrate and the circuit or element formed thereon. In addition, the photothermal conversion layer 120 may have adhesion of 150 gf/25 mm to 1600 gf/25 mm with respect to the supporter.

The adhesive film of the present disclosure includes the photothermal conversion layer 120, and the base film layer 140 to support the first adhesive layer 130 and the second adhesive layer 150. The base film layer 140 may be a film of a hard material.

The base film layer 140 of the hard material may make it easy to remove the first adhesive layer 130 and the second adhesive layer 150 remaining on the substrate after the photothermal conversion layer 120 is separated through laser projection after the processing process of the substrate is finished.

The base film layer 140 may be a PI film. The base film layer 140 may have an excellent heat resisting property and a low coefficient of thermal expansion (CTE). Preferably, the base film layer 140 may have a CTE value less than or equal to about 25 ppm.

A thickness of the base film layer 140 may be about 25 μm to about 75 μm, preferably, may be about 30 μm to about 70 μm, and more preferably, may be about 35 μm to about 50

µm. If the thickness of the photothermal conversion layer 120 is less than about 25 µm, the base film layer 140 is so thin that a coating ability in a coating process is reduced and it is difficult to adjust the thickness. In addition, if the thickness of the base film layer 140 exceeds about 75 µm, the overall thickness of the adhesive film becomes thicker and the adhesive film becomes rigid, and lamination or adhesion performance on the substrate and the supporter is reduced.

The base film layer 140 may have a protrusion formed on a side surface of the adhesive film although it is not illustrated in the drawing. If the base film layer 140 has the protrusion, the adhesive film can be removed by pulling the protrusion after the supporter is removed from the photothermal conversion layer 120 after the substrate processing process is finished. The adhesive film is removed without using a separate removal tape, so that the process can be performed more simply and efficiently.

The first adhesive layer 130 is used to bond the base film layer 140 and the photothermal conversion layer 120 to each other. If the first adhesive layer 130 is omitted and the photothermal conversion layer 120 and the base film layer 140 are directly bonded to each other, there is a problem that detachment may occur at a temperature higher than or equal to about 230° C.

The first adhesive layer 130 can enhance lamination performance of the photothermal conversion layer 120 and the base film layer 140, and increase adhesion of the photothermal conversion layer 120 and the base film layer 140 at a high temperature, thereby enabling a high-temperature process. That is, the first adhesive layer 130 is a layer that contacts the photothermal conversion layer 120 and has excellent adhesion.

On the other hand, the second adhesive layer 150 is used to fix the substrate. After the substrate and the supporter are separated from each other by division of the photothermal conversion layer 120, the substrate bonded with the second adhesive layer 150 is obtained. Accordingly, the second adhesive layer 150 should be easily separated from the substrate by detachment, etc. The second adhesive layer 150 is a film type formed on the base film layer 140, and is not a photo-curable adhesive that is directly coated on the substrate.

One or more of the first adhesive layer 130 and the second adhesive layer 150 may include a silicon-based adhesive. That is, one or more of the first adhesive layer 130 and the second adhesive layer 150 may be a silicon-based adhesive layer.

Preferably, the adhesive of the silicon-based adhesive layer which is one or more of the first adhesive layer 130 and the second adhesive layer 150 may include a radical curing silicon-based adhesive, or an addition curing silicon-based adhesive.

The addition curing silicon-based adhesive may have high adhesion, and the radical curing silicon-based adhesive may have a higher heat resisting property than that of the addition curing silicon-based adhesive. Accordingly, it is more preferable that the first adhesive layer 130 includes the addition curing silicon-based adhesive, and the second adhesive layer 150 includes the radical curing silicon-based adhesive. In this case, the first adhesive layer 130 may further include an anchoring agent.

In a substrate processing process, in particular, in a semiconductor manufacturing process, an adhesive film having excellent stability in a high-temperature condition is required. However, in the case of an acrylic adhesive layer, there is a limit to the heat-resisting property, and the acrylic adhesive layer cannot be applied to a semiconductor manufacturing process that requires a temperature higher than or equal to 200° C. If the process proceeds at a higher temperature or continues for a long time, the adhesive of the acrylic adhesive layer may melt down.

In addition, since the acrylic adhesive, etc. has a high CTE, but has a low modulus and is flexible, there may be a reaction to deformation of a material at a high temperature. Accordingly, the acrylic adhesive has a poor heat resisting property to be used in a high-temperature process, and has a problem of reduced adhesion in a high-temperature condition.

On the other hand, the silicon-based adhesive layer has excellent stability at a high temperature, and has an excellent heat resisting property. In addition, the silicon-based adhesive layer may be softer than adhesive layers of other materials, for example, the acrylic adhesive layer, so that lamination performance is excellent when the silicon-based adhesive layer bonds a rigid material such as the substrate and the supporter.

Furthermore, softness of the silicon-based adhesive layer enables the second adhesive layer 150 bonded to the substrate to be smoothly removed when the second adhesive layer 150 is detached after the substrate processing process is finished, and can prevent a damage to an element on the substrate. In addition, after the substrate processing process is finished, when the first adhesive layer 130, the base film layer 140, and the second adhesive layer 150 are detached, a high temperature may be used, and accordingly, there is no residue on the substrate.

Specifically, when the silicon-based adhesive is used in the second adhesive layer 150, it is possible to remove the adhesive film only with a small force of about 40 gf/25 mm without two-bond in which an adhesive is detached and separated from a base material at a high temperature higher than or equal to 150° C. It is possible to remove the adhesive film with a force of about 200-300 gf/25 mm at a temperature from 60° C. to 100° C. In the case of the acrylic adhesive, cohesion is low at a high temperature and thus it is impossible to remove in this way. The acrylic adhesive leaves residues at a high temperature and the adhesive layer may melt or may be torn.

One or more of the first adhesive layer 130 and the second adhesive layer 150 may include a curing agent. Preferably, the curing agent may be a benzoyl peroxide (BPO) curing agent. More preferably, the benzoyl peroxide (PBO) curing agent may be di-(2,4-dichlorobenzoyl) peroxide or dibenzoyl peroxide. For example, the benzoyl peroxide (PBO) curing agent may be used in a powdery form or a paste form.

A content of the curing agent in one or more of the first adhesive layer 130 and the second adhesive layer 150 may be about 1 weight % to about 4 weight % with reference to a total weight of the adhesive layer, preferably, may be about 1 weight % to about 3 weight %, and more preferably, may be about 2 weight % to about 3 weight %.

If the content of the curing agent is less than about 1 weight %, reactivity may be reduced. In addition, if the content of the curing agent exceeds about 4 weight %, an excessive amount of curing agent does not react and there may remain a unreacted curing agent, and there may be a problem on a surface of the adhesive layer after curing and drying.

One or more of the first adhesive layer 130 and the second adhesive layer 150 may further include an additive. The additive serves to remove moisture in the silicon-based adhesive layer. That is, by removing moisture in the adhesive layer by using the additive, curing efficiency of the adhesive layer can be enhanced, and accordingly, the heat resisting property of the adhesive layer can be further enhanced.

Preferably, the additive may be $TiO_2$. For example, in the case of $Al_2O_3$ or $SiO_2$, dispersibility is low and a dispersing agent is required. However, in the case of the silicon-based adhesive layer, an aromatic solvent is used as a solvent, and most of the dispersing agents have difficulty in doing their roles, and, when a dispersing agent is added, the heat-resisting property of the silicon may be reduced due to the dispersing agent.

In the case of $TiO_2$, dispersibility is very excellent and $TiO_2$ can be applied as a filler without a special dispersing agent. In addition, since moisture, etc. can be removed, a curing reaction can be prevented from being reduced by moisture when there is a radical reaction of silicon.

A size of the additive in one or more of the first adhesive layer 130 and the second adhesive layer 150 may be about 100 nm to about 500 nm, preferably, may be about 200 nm to about 400 nm, and more preferably, may be about 200 nm to about 300 nm.

If the size of the additive is less than about 100 nm, dispersibility may be reduced and an amount to be loaded may be limited. In addition, if the size of the additive exceeds about 500 nm, the additive may be deposited as a time is elapsed after the additive is dispersed, and there may be a problem that illuminance of a surface is not good when a resin is coated.

A content of the additive in one or more of the first adhesive layer 130 and the second adhesive layer 150 may be about 1 weight % to about 10 weight % with reference to a total weight of each adhesive layer, preferably, may be about 1 weight % to about 8 weight %, and more preferably, may be about 1 weight % to about 5 weight %.

If the content of the additive is less than about 1 weight %, the effect of the additive is not likely to be shown. In addition, if the content of the additive exceeds about 10 weight %, there may be a problem on the surface of the adhesive layer or adhesion may be reduced.

A thickness of the first adhesive layer 130 may be about 25 μm to about 45 μm, preferably, may be about 30 μm to about 40 μm, and more preferably, may be about 30 μm.

If the thickness of the first adhesive layer 130 is less than about 25 μm, inter-layer detachment may occur due to low adhesion when a high-temperature process is performed for a long time. In addition, if the thickness of the first adhesive layer 130 exceeds about 45 μm, a solvent may evaporate during a drying and curing process, causing a defect on the surface of the first adhesive layer 130.

A thickness of the second adhesive layer 150 may be about 5 μm to about 100 μm, preferably, may be about 20 μm to about 60 μm, and more preferably, may be about 20 μm to about 50 μm.

If the thickness of the second adhesive layer 150 is less than about 5 μm, inter-layer detachment may occur when a device is excessively distorted due to low adhesion. In addition, if the thickness of the second adhesive layer 150 exceeds about 100 μm, drying efficiency may deteriorate when the second adhesive layer 150 is formed, and there is a probability that a solvent remains, and cohesion of the second adhesive layer 150 may be reduced and there may be residues, and it may be difficult to fix due to softness of the second adhesive layer 150 when the substrate is processed.

Although not shown in the drawing, a primer layer may be disposed on the base film layer 140 on a surface contacting one or more of the first adhesive layer 130 and the second adhesive layer 150. The primer layer may reinforce a bonding force of the first adhesive layer 130 or the second adhesive layer 150 and the base film layer 140.

The primer layer may be disposed between an adhesive layer including a radical curing silicon-based adhesive and the base film layer. Preferably, the primer layer may be disposed between the second adhesive layer 150 and the base film layer 140. The first adhesive layer 130 may include an addition curing silicon-based adhesive, and may further include an anchoring agent, which performs the role of the primer. Accordingly, the primer layer may be omitted between the first adhesive layer 130 and the base film layer 140.

The primer layer may be formed on the base film layer 140, and may include an addition curing rein, a platinum catalyst, a cross-linking agent. The primer layer may be coated on the base film layer 140 before the first adhesive layer 130 or the second adhesive layer 150 is coated, and may be cured at a temperature higher than or equal to about 140° C.

A thickness of the primer layer may be about 50 nm to about 500 nm, preferably, may be about 50 nm to about 300 nm, and more preferably, may be about 100 nm to about 300 nm.

If the thickness of the primer layer is less than about 100 nm, there may be a problem. In addition, if the thickness of the adhesive layer exceeds about 500 nm, there may be an influence on the heat-resisting property of the adhesive layer, causing a defect in a process.

The first liner 110 and the second liner 160 serve to support and to protect the photothermal conversion layer 120 and the second adhesive layer 150, respectively. The first liner 110 and the second liner 160 may be removed when the adhesive film is used.

The first liner 110 and the second liner 160 may be silicon-coated polyethylene terephthalate (PET), but is not limited thereto and any material to support and protect the adhesive film can be used.

A manufacturing process of the adhesive film according to an embodiment of the present disclosure will be described hereinbelow.

The primer layer is coated on the base film layer 140. Thereafter, the second adhesive layer 150 is formed on the base film layer 140, which is coated with the primer layer, and the second liner 160 is attached to the second adhesive layer 150. Thereafter, the first adhesive layer 130 is formed on the opposite surface of the base film layer 140 to the surface where the second adhesive layer 150 is formed.

The photothermal conversion layer 120 of a film type is formed on the first liner 110. Thereafter, the first adhesive layer 130 formed on the base film layer 140 and the photothermal conversion layer 120 are laminated one on another in a roll-to-roll method.

However, the manufacturing process of the adhesive film of the present disclosure is not limited thereto, and any method that can laminate a plurality of layers of an adhesive film can be applied.

If a liquid adhesive material and a liquid photothermal conversion material are used between the substrate and the supporter, a process of forming a photothermal conversion layer by coating a photothermal conversion material on the supporter and curing, and a process of forming an adhesive layer by coating an adhesive material on the substrate to be processed, and curing are required, respectively. Thereafter, a process of bonding the adhesive layer and the photothermal conversion layer under vacuum is required. That is, if a liquid material is used, a coating time, a curing time, and a bonding time are required.

On the other hand, if the adhesive film of the film type according to the present disclosure is used, only the process of removing the second liner and attaching the second adhesive layer to the substrate, and removing the first liner and attaching the photothermal conversion layer to the supporter is required. Accordingly, the present disclosure can noticeably save the time required to process, and can save a cost necessary for a coating process, a curing process, a vacuum process, etc.

Hereinbelow, an adhesive film according to another embodiment of the present disclosure will be described with reference to FIG. 2. A redundant explanation of the same portion as the adhesive film described above may be omitted, and the same reference numerals indicate the same components.

Figure 2:
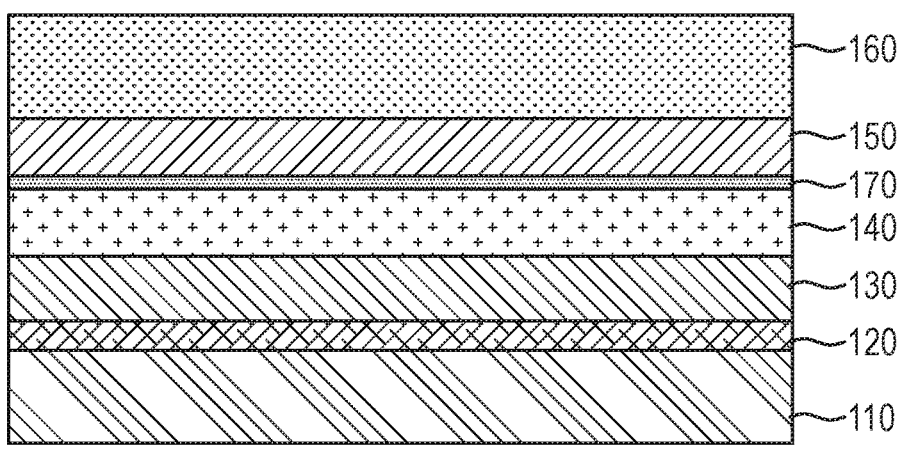
FIG. 2 is a cross-sectional view of an adhesive film according to another embodiment of the present disclosure.

FIG. 2 is a cross-sectional view of an adhesive film according to another embodiment of the present disclosure. Referring to FIG. 2, the adhesive film according to another embodiment of the present disclosure includes a first liner 110, a photothermal conversion layer 120, a first adhesive layer 130, a base film layer 140, a metal layer 170, a second adhesive layer 150, and a second liner 160, which are stacked in sequence.

Although FIG. 2 illustrates that the metal layer 170 is disposed between the base film layer 140 and the second adhesive layer 150, the metal layer 170 may be disposed on at least one surface of the base film layer 140. That is, the metal layer 170 may be disposed between the base film layer 140 and the first adhesive layer 130, and/or between the base film layer 140 and the second adhesive layer 150.

The metal layer 170 can block a laser which leaks when a laser is projected onto the photothermal conversion layer 120 after the substrate processing process, and can prevent the laser from influencing an element on the substrate.

The metal layer 170 may be vapor-deposited and formed on the base film layer 140. Preferably, the metal layer 170 includes metal selected from the group consisting of copper, aluminum, tungsten, silver, gold, chrome, and a combination thereof.

A thickness of the metal layer 170 may be about 100 nm to about 1 μm, preferably, may be about 100 nm to about 500 nm, and more preferably, may be about 100 nm to about 300 nm. If the thickness of the metal layer 170 is less than about 100 nm, the performance of blocking the leaking laser may be reduced. In addition, if the thickness of the metal layer 170 exceeds about 1 μm, compatibility with a primer layer or the adhesive layer may be reduced and there is a probability that two-bond occurs.

If the primer layer and the metal layer 170 are positioned on the same surface such as the base film layer 140, the metal layer 170 may be vapor-deposited on the base film layer 170, and the primer layer may be disposed on the metal layer 170.

A manufacturing process of the adhesive film according to the present embodiment will be described hereinbelow.

The metal layer 170 is vapor-deposited on the base film layer 140. Thereafter, the second adhesive layer 150 is formed on the base film layer 140, which is coated with the metal layer 170, and the second liner 160 is attached to the second adhesive layer 150. Thereafter, the first adhesive layer 130 is formed on the opposite surface of the base film layer 140 to the surface where the second adhesive layer 150 is formed.

The photothermal conversion layer 120 of a film type is formed on the first liner 110. Thereafter, the first adhesive layer 130 formed on the base film layer 140 and the photothermal conversion layer 120 are laminated one on another in a roll-to-roll method.

However, the manufacturing process of the adhesive film of the present disclosure is not limited thereto, and any method that can laminate a plurality of layers of an adhesive film can be applied.

FIGS. 3A to 3D are views illustrating a process of processing a substrate which uses the adhesive film according to the present disclosure.

Figure 3A:
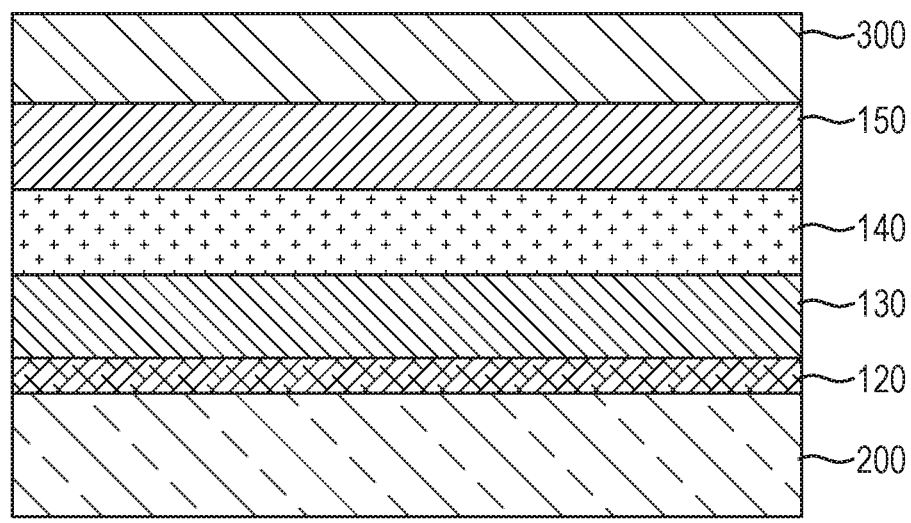
FIGS. 3A to 3D are views illustrating a process of processing a substrate which uses an adhesive film according to the present disclosure.

Referring to FIG. 3A, the first liner is removed from the adhesive film according to the present disclosure, and the photothermal conversion layer 120 is attached to a supporter 200, and the second liner is removed and the second adhesive layer 150 is attached to a substrate 300. In this case, it is preferable that the process is performed at about 40° C. to about 80° C., so that stickiness between the photothermal conversion layer 120 and the supporter 200 can increase.

The supporter 200 is a material that enables radiant energy such as a laser used in the present disclosure to pass therethrough, and this material is required to maintain the substrate 300 in a flat state and to prevent the substrate 300 from being destroyed during processing and conveyance. The supporter 200 is preferably hard and has a light transmitting property.

The light transmitting property of the supporter 200 is not limited as long as radiant energy is not prevented from transmitting into the photothermal conversion layer 120 to divide the photothermal conversion layer 120. However, transmissivity may be preferably greater than or equal to about 50%, for example.

In addition, it is preferable that the supporter 200 has high rigidity in order to prevent the substrate from being distorted during processing, and a bending strength of the supporter 200 is preferably greater than or equal to $2\times10^{-3}$ (Pa·m$^3$), and more preferably, is greater than or equal to $3\times10^{-2}$ (Pa·m$^3$).

In addition, it is preferable that the supporter 200 has a sufficient heat resisting property to prevent a damage caused by a thermal history that may occur when the process on the substrate is performed, and a heat deflection temperature of the supporter 200 is preferably higher than or equal to 550° C., and more preferably, is higher than or equal to 700° C.

The supporter 200 may be, for example, glass. When necessary, the supporter 200 may be surface-treated by a bonding agent, etc. to enhance an adhesion strength on an adjacent layer such as the photothermal conversion layer 120.

Thereafter, the substrate 300 and the supporter 200 are fixed with the adhesive film including the photothermal conversion layer 120, the first adhesive layer 130, the base film layer 140 and the second adhesive layer 150 being placed therebetween, and then the substrate 300 is processed. The adhesive film may additionally include a metal layer and/or a primer layer although it is not illustrated in the drawing.

The substrate 300 is a substrate that is fixed to the supporter 200 and is processed, and then, is separated from the supporter 200, and may be, for example, a wafer or a substrate for a flexible display device.

For example, the substrate 300 may include a semiconductor wafer such as silicon and gallium arsenide, a crystal wafer, sapphire, or glass. A circuit surface of such a substrate 300 may be bonded with the adhesive layer. Thereafter, the substrate 300 may be processed into a thin film substrate by grinding a surface of the substrate 300 that is not bonded with the adhesive layer through a grinder, etc.

In another example, the substrate 300 may be an epoxy mold wafer. A mold surface of such a substrate 300 may be bonded with the adhesive layer, and then, may be processed into a completed substrate by performing a predetermined process to connect a circuit on a surface of the substrate 300 that is not bonded with the adhesive layer.

In still another example, the substrate 300 may use a plastic or a metal thin film as a flexible substrate. For example, the substrate 300 may be PI. However, this should not be considered as limiting, and any material that has flexibility and can be used for a substrate for a flexible display device can be used.

For example, "processing" may include a process of forming an element layer on the substrate 300. Although not shown, the element layer may include a plurality of thin film layers and electric elements, and more specifically, may include a thin film transistor including a gate electrode, a semiconductor layer, a source electrode, and a drain electrode.

The flexible display device may be any one selected from the group consisting of an organic light emitting diode display device, a liquid crystal display device, and an electro-phoresis display device. However, this should not be considered as limiting, and the flexible display device may include all flexible display devices using flexible substrates.

Figure 3B:
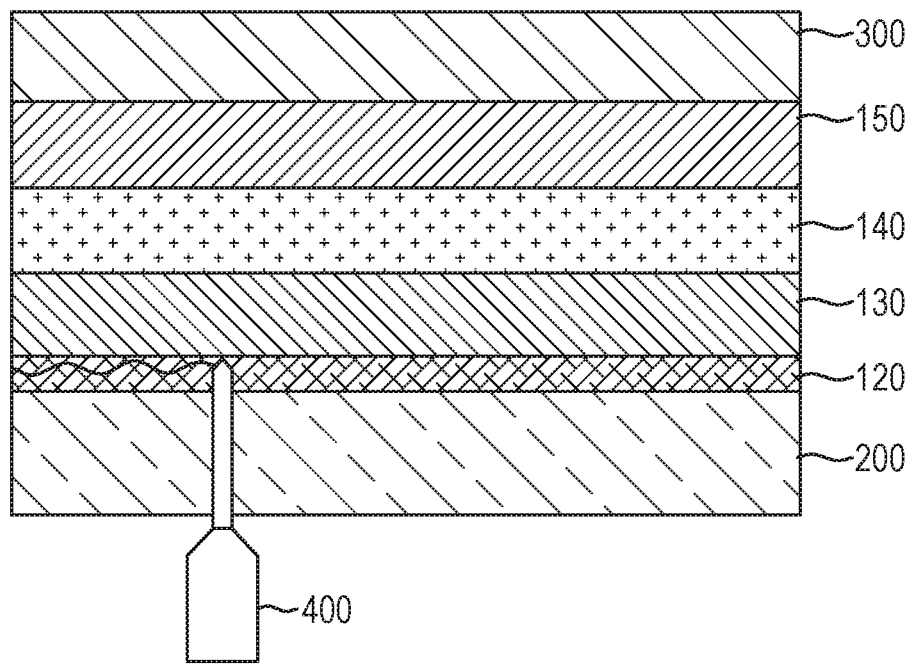

Referring to FIG. 3B, after a desired process is performed, the supporter 200 and the processed substrate 300 are separated by projecting a laser 400. The laser 400 is projected from the supporter 200.

Radiant energy generated by the laser 400 is absorbed by the light absorbing agent of the photothermal conversion layer 120, and is converted into thermal energy. The generated thermal energy abruptly increases a temperature of the photothermal conversion layer 120, and the temperature causes decomposition of the pyrolytic resin in the photothermal conversion layer 120. A gas generated by thermal decomposition forms an opening layer in the photothermal conversion layer 120, and divides the photothermal conversion layer 120 into two portions, and accordingly, the supporter 200 and the processed substrate 300 are separated.

The pyrolytic resin in the photothermal conversion layer 120 is decomposed by projection of the laser 400, and forms a crack inside the layer to divide the photothermal conversion layer. Air (gas) generated by decomposition of the resin enters between the two layers and separates the two layers from each other. Accordingly, in order to promote the entry of air, it is preferable to project the laser 400 from a border portion of the photothermal conversion layer 120 toward the inside of the photothermal conversion layer 120.

A method of applying the laser 400 while reciprocating linearly from the border portion may be used to use the laser 400 from the border portion of the photothermal conversion layer 120, or alternatively, a method of projecting the laser 400 in a spiral pattern from the border portion toward the center like a phonograph may be used.

The laser 400 may be a laser having a wavelength generally ranging from about 300 to about 11,000 nm, preferably, from about 300 to about 2,000 nm, and a specific example thereof includes a YAG laser emitting light at a wavelength of 1,064 nm, a second harmonic wave generation YAG laser of a wavelength of 532 nm, and a semiconductor laser of a wavelength of 780 to 1,300 nm.

Figure 3C:
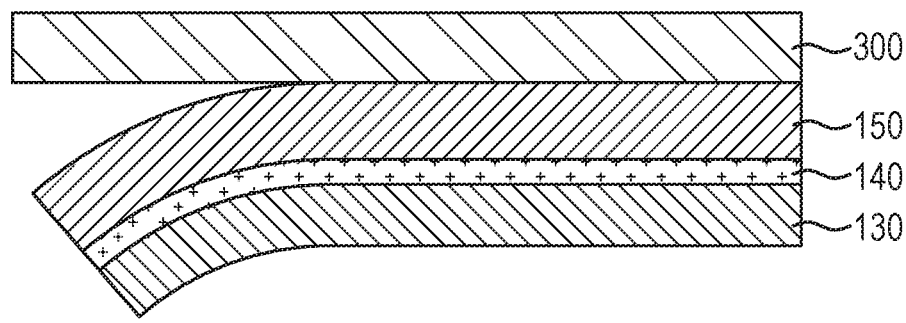

Referring to FIG. 3C, after the supporter 200 is removed, the first adhesive layer 130, the base film layer 140, and the second adhesive layer 150 on the processed substrate 300 are removed. To remove the first adhesive layer 130, the base film layer 140, and the second adhesive layer 150, a removal tape 500 which has stronger adhesion with the first adhesive layer 130 than adhesion between the processed substrate 300 and the second adhesive layer 150 is preferably used.

Such a removal tape 500 may be disposed to be bonded to the first adhesive layer 130, and then may be detached along with the first adhesive layer 130, the base film layer 140, and the second adhesive layer 150, thereby removing the first adhesive layer 130, the base film layer 140, and the second adhesive layer 150 from the processed substrate 300.

Although not clearly illustrated in the drawing, a portion of the photothermal conversion layer 120 may remain on the first adhesive layer 130 after the photothermal conversion layer 120 is divided. The remaining portion may also be removed when the removal tape 500 is used.

Figure 3D:
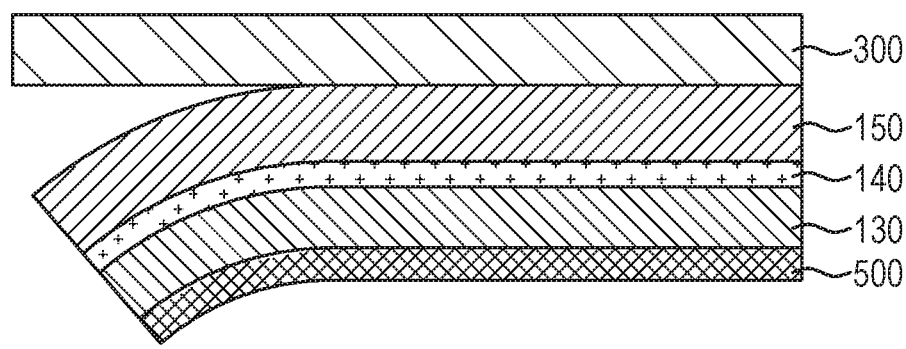

Referring to FIG. 3D, since the base film layer 140 has rigidity, the first adhesive layer 130, the base film layer 140, and the second adhesive layer 150 can be removed by pulling the base film layer 140 without a removal tape when the first adhesive layer 130, the base film layer 140, and the second adhesive layer 150 are removed.

In this case, the base film layer 140 may be formed to protrude from a side surface of the adhesive film. That is, the base film layer 140 has a protrusion, and through the protrusion, the first adhesive layer 130, the base film layer 140, and the second adhesive layer 150 can be removed.

The substrate processing method according to the present disclosure uses an already manufactured adhesive film, and thus is eco-friendly since a solvent is not required when the substrate is processed. In addition, when the already manufactured adhesive film is used, exposure of the supporter and the substrate to heat and UV can be reduced when the substrate is processed, and an additional damage can be prevented.

In addition, a process of directly coating an adhesive material or a photothermal conversion material on the supporter or the substrate, and curing is omitted, so that the process can be simplified and a processing cost and a time can be saved. Furthermore, the method is advantageous for forming uniform thicknesses of the adhesive layer and the photothermal conversion layer, and can be used in a process of processing a large-area substrate.

Hereinafter, the present disclosure will be described in more detail through experiment embodiments, but the experiment embodiments presented below are merely examples to exemplify the present disclosure, and are not intended to limit the present disclosure. That is, embodiments of the present disclosure can be changed in various forms, and the scope of the present disclosure should not be interpreted as being limited by the experiment embodiments presented below.

EXAMPLES

Example 1

Manufacturing Example 1—Base Film Layer

A PI film (GF-100; SK Kolon PI) of 25 μm was prepared. A primer layer including a primer resin (7499; Dow), a cross-linking agent (7387; Dow) and a platinum catalyst (4000; Dow) was formed on the PI film.

Manufacturing Example 2—Manufacturing of the First Adhesive Layer 80 g of a solvent (Toluene) was prepared. 100 g of a silicon resin (SG6501A; KCC) was introduced into the solvent. 2 g of a platinum catalyst (GF-100; KCC) was introduced into the solution, and an anchoring agent (SC0050S; KCC) was added by 0.7 weight % with reference to a weight of the silicon resin. The solution was agitated by using an agitator at 12 RPM for 30 minutes.

A mixture was formed by de-airing the solution by using a vacuum pump and a vacuum desiccator for 30 minutes. Thereafter, the mixture was filtered by using a 250-300 mesh filter.

The filtered solution was coated on the PI film of manufacturing example 1 such that a thickness of a coating film after drying reaches 30 μm. After being dried at 80° C. for 1 minute, the solvent was cured at 160° C. for two minutes.

Manufacturing Example 3—Manufacturing of the Second Adhesive Layer 80 g of a solvent (Toluene/Xylene) was prepared. Benzoyl peroxide (BPO, PEROXAN BD-Paste 50 SI; Pergan) was introduced into the solvent. An introduced amount was 3.5 weight % compared to solid of a silicon resin and a siloxane polymer to be added afterward. $TiO_2$ was added to the BPO solution by 5 weight % compared to the solid of the silicon resin to be added afterward. The BPO was completely dissolved and $TiO_2$ was dispersed by agitating at 10 to 15 RMP for 15 minutes by using an agitator.

100 g of a silicon resin (7355; Dow) and 50 g of a siloxane polymer (7450; Dow) were introduced into the dissolved BPO solution, and the solution was agitated again for 30 minutes in the same way. A mixture was formed by de-airing the solution by using a vacuum pump and a vacuum desiccator for 30 minutes. Thereafter, the mixture was filtered by using a 250-300 mesh filter.

The filtered solution was coated on a surface on the PI film where the first adhesive layer is not formed in manufacturing example 2, such that s thickness of a coating film after drying reaches 30 μm. After being dried at 80° C. for 1 minute, the solvent was cured at 185° C. for three minutes.

Manufacturing Example 4—Manufacturing of the Photothermal Conversion Layer 6 weight % of carbon black (Cancarb) having a particle size of 240 nm, 4 weight % of titania (Huntsman) having a particle size of 240 nm, and 1 weight % of a dispersing agent (BYK Chemie Japan Co., Ltd.) were added to 75 weight % of methyl ethyl ketone (MEK; Samchun chemical Co., Ltd.), and were dispersed by using an ultrasonic diffuser for 30 minutes, and a solution in which a light absorbing agent is dispersed was manufactured. A pyrolytic resin was manufacturing by mixing 7 weight % of a low molecular weight acrylic polymer elastic material, rather than a PSA having a weight average molecular weight of 1,000,000 g/mol and including a COOH/OH functional group greater than or equal to 10 mgKOH/g, and a PSA having 7 weight % of a high molecular weight acrylic polymer elastic material and a weight average molecular weight of 500,000 g/mol, and including a COOH/OH functional group greater than or equal to 5 mgKOH/g, and by agitating for 30 minutes through an agitator. The pyrolytic resin was added to the solution in which the light absorbing agent is dispersed and then was agitated again for 20 minutes. Thereafter, methyl ethyl ketone (MEK) was added such that the mixture has a viscosity (200 CPS~5,000 CPS) appropriate for coating.

The solution was coated on the first adhesive layer prepared in manufacturing example 2. The solution was coated and dried such that a thickness of a coating film after being dried at 90° C. for 1 minute reaches 10 μm.

Thereafter, an adhesive film was completed by aging the adhesive film in an oven at 45° C. for 15 hours.

Example 2

An adhesive film was manufactured in the same way as in Example 1 except that a base film layer was prepared by vapor-depositing copper on the PI film with a thickness of 300 nm.

Comparison Example 1

A photothermal conversion layer was manufactured in the same way as in Example 1 except that the photothermal conversion layer was coated on a first liner and dried. An adhesive film was manufactured by forming an adhesive layer (3M, ATT4025) including an acrylic adhesive on a second liner, and laminating the photothermal conversion layer and the adhesive layer through a roll-to-roll process.

Comparison Example 2

An adhesive film was manufactured in the same way as in Example 1, except that the first adhesive layer was omitted in Example 1 and a photothermal conversion layer was directly laminated on the PI film.

Experiment 1—Evaluation of a Heat Resisting Property and Detachment Residues

Example 1, Comparison Example 1, Comparison Example 2 were maintained at 230° C. for 2 hours and their heat resisting properties were tested.

To evaluate the detachment residues, Example 1, Comparison Example 1, and Comparison Example 2 were bonded to a Si wafer and then were aged at 200° C. for 1 hour, and the adhesive film in Comparison Example 1 was removed by using a removal tape, and the adhesive film in Example 1 and Comparison Example 2 was removed by pulling the PI film, and results thereof were identified.

The results of the experiment are as in table 1 presented below:

TABLE 1

| | Example 1 | Comparison Example 1 | Comparison Example 2 |
|---|---|---|---|
| Test of heat-resisting property | Maintained at 230° C. for two hours without detachment | The adhesive and the wafer were detached due to a low heat-resisting property of the acrylic adhesive | There was no problem in the heat-resisting property of the adhesive layer including the silicon-based adhesive, but the photothermal conversion layer and the PI film were separated. |

TABLE 1-continued

|  | Example 1 | Comparison Example 1 | Comparison Example 2 |
| --- | --- | --- | --- |
| Test of detachment residues | Removable without a residue even after high-temperature processing | A portion of the adhesive was torn and a portion remains on the wafer | Removable without a residue even after high-temperature processing |

As can be seen from table 1 presented above, a heat resisting property is low if the adhesive layer includes an acrylic adhesive, and it is difficult to maintain adhesion in a high-temperature process, and there is a problem that residues remain. In addition, it can be seen that, if the first adhesive layer is omitted, the photothermal conversion layer and the base film layer are detached from each other.

Experiment 2—Laser Blocking Effect

To test a laser blocking effect, a comparison group in which glass and glass overlap each other was prepared, and Example 1 or Example 2 was disposed between glass and glass, and a laser of 1064 nm was projected.

The results are as in table 2 presented below:

TABLE 2

| Used voltage | Experiment | Speed (mm/s) | Beam size | Laser leakage (W) |
| --- | --- | --- | --- | --- |
| 60 W | Glass/Glass | 2100 | 1.4 mm | 33.5 |
|  | Glass/Example 1/Glass | 2100 | 1.4 mm | 0.2 (0.60%) |
|  | Glass/Example 2/Glass | 2100 | 1.4 mm | 0.0 |
| 100 W | Glass | 2100 | 1.4 mm | 52.5 |
|  | Glass/Example 1/Glass | 2100 | 1.4 mm | 0.6 (1.14%) |
|  | Glass/Example 2/Glass | 2100 | 1.4 mm | 0.2 (0.38%) |

As can be seen from table 2 presented above, nearly all of the lasers were blocked even in Example 1. However, it can be seen that Example 2 in which the metal layer is added shows an enhanced laser blocking effect compared to Example 1.

Although embodiments of the present disclosure have been described, they are merely examples, and it will be understood by a person skilled in the art that various changes can be made therefrom and other equivalent embodiments are possible. Therefore, the scope of the present disclosure should be construed as including not only the claims presented below but also an equivalent scope thereto.

DESCRIPTION OF REFERENCE NUMERALS

110: first liner; 120: photothermal conversion layer; 130: first adhesive layer; 140: base film layer; 150: second adhesive layer; 160: second liner; 200: supporter; 300: substrate; 400: laser; 500: removal tape.

What is claimed is:

1. An adhesive film comprising:
    a photothermal conversion layer comprising a light absorbing agent and a pyrolytic resin;
    a first adhesive layer disposed on the photothermal conversion layer;
    a base film layer disposed on the first adhesive layer; and
    a second adhesive layer disposed on the base film layer,
    wherein the first adhesive layer comprises an addition curing silicon-based adhesive, and the second adhesive layer comprises a radical curing silicon-based adhesive.

2. The adhesive film of claim 1,
    wherein one or more of the first adhesive layer and the second adhesive layer additionally comprise a benzoyl peroxide curing agent.

3. The adhesive film of claim 1,
    wherein one or more of the first adhesive layer and the second adhesive layer additionally comprise $TiO_2$.

4. The adhesive film of claim 1, further comprising
    a primer layer disposed between the second adhesive layer and the base film layer.

5. The adhesive film of claim 1,
    wherein the base film layer is a film.

6. The adhesive film of claim 1,
    wherein the base film layer has a protrusion formed on a side surface of the adhesive film.

7. The adhesive film of claim 1,
    wherein the pyrolytic resin has a —COOH or —OH functional group, and comprises two kinds of acrylic resins having different weight average molecular weights.

8. The adhesive film of claim 1, further comprising
    a metal layer disposed on at least one surface of the base film.

9. The adhesive film of claim 8,
    wherein the metal layer comprises metal selected from the group consisting of copper, aluminum, tungsten, silver, gold, chrome, and a combination thereof.

* * * * *

UNITED STATES PATENT AND TRADEMARK OFFICE
CERTIFICATE OF CORRECTION

PATENT NO. : 12,371,590 B2  
APPLICATION NO. : 17/769714  
DATED : July 29, 2025  
INVENTOR(S) : Kyosung Hwang et al.

Page 1 of 1

It is certified that error appears in the above-identified patent and that said Letters Patent is hereby corrected as shown below:

In the Claims

Column 20
Line 34, In Claim 5, delete "base film layer is a film" and insert -- base film layer is a polyimide film --, therefor.

Signed and Sealed this
Twenty-seventh Day of January, 2026

John A. Squires
*Director of the United States Patent and Trademark Office*